(12) United States Patent
Choi et al.

(10) Patent No.: US 11,798,822 B2
(45) Date of Patent: Oct. 24, 2023

(54) SUPPORT UNIT, SUBSTRATE TREATING APPARATUS INCLUDING THE SAME, AND SUBSTRATE TREATING METHOD

(71) Applicant: SEMES CO., LTD., Cheonan-si (KR)

(72) Inventors: Ye Jin Choi, Seoul (KR); Daehun Kim, Pyeongtaek-si (KR); Kangseop Yun, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 365 days.

(21) Appl. No.: 17/061,629

(22) Filed: Oct. 2, 2020

(65) Prior Publication Data

US 2021/0104420 A1 Apr. 8, 2021

(30) Foreign Application Priority Data

Oct. 2, 2019 (KR) .......................... 10-2019-0121940

(51) Int. Cl.
*H01L 21/67* (2006.01)

(52) U.S. Cl.
CPC .... *H01L 21/67115* (2013.01); *H01L 21/6715* (2013.01); *H01L 21/67109* (2013.01)

(58) Field of Classification Search
CPC ............................................... H01L 21/67715
See application file for complete search history.

(56) References Cited

U.S. PATENT DOCUMENTS 5,792,273 A * 8/1998 Ries ...................... C23C 16/481
392/420
2010/0261122 A1* 10/2010 Inatomi ............... H01L 21/6715
399/222
2012/0325795 A1* 12/2012 Suzuki ............. H01L 21/67109
219/209
2015/0071623 A1* 3/2015 Ranish ................ H05B 1/0233
392/428
2016/0013079 A1* 1/2016 Choi ................. H01L 21/67051
156/345.21
2019/0198299 A1* 6/2019 Watanabe ......... H01L 21/67115

FOREIGN PATENT DOCUMENTS

| JP | 2014-175638 A | 9/2014 | |
| KR | 10-2014-0047564 A | 4/2014 | |
| KR | 10-2016-0008065 A | 1/2016 | |
| KR | 10-2016-0118116 A | 10/2016 | |
| KR | 101757813 B1 | 7/2017 | |
| KR | 10-2018-0124267 A | 11/2018 | |
| KR | 2018124267 A | * 11/2018 | .......... H01L 21/324 |
| KR | 10-2019-0037824 A | 4/2019 | |

OTHER PUBLICATIONS

Korean Office Action dated Feb. 5, 2021 issued in corresponding Korean Appln. No. 10-2019-0121940.
Korean Office Action dated Aug. 25, 2021 issued in corresponding Korean Appln. No. 10-2019-0121940.

* cited by examiner

*Primary Examiner* — Alia Sabur
(74) *Attorney, Agent, or Firm* — Harness, Dickey & Pierce, P.L.C.

(57) ABSTRACT

Disclosed is a support unit for supporting a substrate. The support unit includes a support plate having an inner space defined therein, a heating member disposed in the inner space and emitting light for heating the substrate supported on the support unit, and a reflective member disposed along an edge region of the support plate and reflecting thermal energy of the light to an edge region of the substrate supported on the support unit.

16 Claims, 13 Drawing Sheets

SUPPORT UNIT, SUBSTRATE TREATING APPARATUS INCLUDING THE SAME, AND SUBSTRATE TREATING METHOD

CROSS-REFERENCE TO RELATED APPLICATIONS

A claim for priority under 35 U.S.C. § 119 is made to Korean Patent Application No. 10-2019-0121940 filed on Oct. 2, 2019, in the Korean Intellectual Property Office, the entire contents of which are hereby incorporated by reference.

BACKGROUND

Embodiments of the inventive concept described herein to a substrate treating apparatus, and more particularly, to a substrate treating apparatus that performs a substrate treating process while heating a substrate during the substrate treating process.

In general, a process for treating a glass substrate or a wafer in a flat panel display device manufacturing or semiconductor manufacturing process includes various processes such as a photoresist coating process, a developing process, an etching process, and an ashing process. In each process, a wet cleaning process using chemical or deionized water to remove various contaminants attached to the substrate, and a drying process to dry the chemical or deionized water remaining on a surface of the substrate are executed.

In relation to the etching process, recently, a silicon nitride film and a silicon oxide film are selectively removed using a chemical used at high temperature such as sulfuric acid or phosphoric acid. In addition, a substrate treating apparatus that heats a substrate when supplying the chemical in order to increase etching efficiency is used.

FIG. 1 is a view showing a state of heating a substrate in a general substrate treating apparatus. A general substrate treating apparatus 5000 includes a support plate 5100, a lamp 5200, a support pin 5300, and a chuck pin 5400.

A substrate W may be a wafer. The substrate W is supported, on a bottom surface and a side surface thereof, by the support pin 5300 and the chuck pin 5400. The support plate 5100 may include an upper plate 5110 and a lower plate 5120. A plurality of lamps 5200 may be provided in the support plate 5100. Each of the plurality of lamps 5200 may emit light. Thermal energy of the light is transferred to the substrate W to heat the substrate W. In this case, an edge region of the substrate W may have a lower heat energy transfer than those of other regions. For example, when viewed from above, light emitted from at least two lamps 5200 is transmitted to a middle region of the substrate W, so that a temperature of the substrate W in the middle region is smoothly increased. However, the number of ramps 5200 involved in increasing a temperature of the edge region of the substrate W is smaller than that in the middle region. Accordingly, as shown in FIG. 2, an etching rate E/R decreases toward the edge region of the substrate W. In order to solve this problem, it is possible to consider an approach in which a heat source is additionally installed at a position corresponding to the edge region of the substrate W. However, the additional installation thereof may be difficult due to interference thereof with the chuck pin 5400.

SUMMARY

Embodiments of the inventive concept provide a support unit capable of efficiently treating a substrate, a substrate treating apparatus including the same, and a substrate treating method.

In addition, embodiments of the inventive concept provide a support unit allowing a substrate to be uniformly heated, a substrate treating apparatus including the same, and a substrate treating method.

In addition, embodiments of the inventive concept provide a support unit capable of improving an etching rate for a substrate, a substrate treating apparatus including the same, and a substrate treating method.

In addition, embodiments of the inventive concept provide a support unit capable of minimizing a frequency of abnormal operation or failure of a spin driver rotating a substrate, a substrate treating apparatus including the same, and a substrate treating method.

Purposes of the inventive concept are not limited thereto, and other purposes as not mentioned will be clearly understood by those skilled in the art from following descriptions.

According to one aspect, an apparatus for treating a substrate includes a support unit supporting the substrate, and a liquid supply unit for supplying a treating liquid to the substrate supported on the support unit, wherein the support unit includes a support plate having an inner space defined therein, a heating member disposed in the inner space and emitting light for heating the substrate supported on the support unit, and a reflective member disposed along an edge region of the support plate, reflecting heat energy of the light and transmitting the heat energy to an edge region of the substrate supported on the support unit.

In one embodiment of the apparatus, the reflective member may have an inclined surface inclined upwards in a direction away from a center of the support plate and along a radial direction of the support plate in a front cross-sectional view of the apparatus.

In one embodiment of the apparatus, the support unit may include a plurality of chucking pins chucking a side surface of the substrate, wherein the reflective member includes a plurality of reflective members, wherein each of the plurality of reflective members may be disposed between adjacent chucking pins when the apparatus is viewed from above.

In one embodiment of the apparatus, the reflective members may be combined with each other to form a partially bent ring when the apparatus is viewed from above.

In one embodiment of the apparatus, each of the chucking pins may be made of a material which the heat energy of the light transmits.

In one embodiment of the apparatus, the heating member may include a plurality of heating members having concentric ring shapes of different radii, respectively, wherein the reflective member may be disposed outside an outermost heating member among the plurality of heating members.

In one embodiment of the apparatus, each heating member may have an inclined surface inclined upwards in a direction away from a center of the support plate and along a radial direction of the support plate in a front cross-sectional view of the apparatus, wherein the support unit may include a reflective ring disposed between the outermost heating member among the plurality of heating members and a heating member adjacent to the outermost heating member, wherein the reflective ring may have an inclined surface inclined upwards in a direction opposite to a direction in which the inclined surface of the heating member is inclined upwards in a front cross-sectional view of the apparatus.

In one embodiment of the apparatus, the support plate may include an upper support plate, and a lower support plate disposed under the upper support plate and combined with the upper support plate to define the inner space therebetween, wherein transparency of the upper support plate may be greater than transparency of the lower support plate.

In one embodiment of the apparatus, the reflective member may be placed under the upper support plate.

In one embodiment of the apparatus, an inner region of an edge region of the lower support plate may be stepped, wherein the reflective member may be disposed on a stepped top surface of the inner region.

In one embodiment of the apparatus, an inner region of an edge region of the lower support plate may be inclined upwards in a direction away from a center of the support plate and along a radial direction of the support plate, wherein the reflective member may be coated on an inclined top surface of the inner region.

In one embodiment of the apparatus, the reflective member may further include a coupler, wherein a bottom surface of the upper support plate may be supported on a top surface of the coupler in a front cross-sectional view of the apparatus.

In one embodiment of the apparatus, the top surface of the coupler may be flat in a front cross-sectional view of the apparatus, wherein one or more holes may be defined in the coupler, wherein coupling means fastened with the upper support plate may be inserted into each hole.

In one embodiment of the apparatus, the heating member may include an infrared lamp for emitting infrared light.

In one embodiment of the apparatus, the heating member may be made of a material including a metal.

In one embodiment of the apparatus, the heating member may be made of a materials including aluminum.

In one embodiment of the apparatus, the support unit may further include an insulating plate disposed in the inner space and disposed under the heating member, and a heat dissipating plate disposed in the inner space and disposed under the insulating plate.

In one embodiment of the apparatus, the heat dissipating plate may be made of a material having higher thermal conductivity than thermal conductivity of the insulating plate.

In one embodiment of the apparatus, a flow path along which a cooling fluid flows may be defined in the heat dissipating plate.

In one embodiment of the apparatus, the support plate may be rotatable, wherein the heating member, the insulating plate, and the heat dissipating plate may be configured to be independent from the rotation of the support plate.

According to another aspect, a method for treating a substrate using the substrate treating apparatus as defined above includes treating the substrate by supplying a treating liquid to the substrate in a heated state thereof, wherein the substrate treating method heats the substrate while supplying the treating liquid to the substrate.

In one embodiment of the method, the method may include a heating step of raising a temperature of the substrate supported on the support plate to a predetermined target temperature, a maintaining step of maintaining the temperature of the substrate at the target temperature for a set time duration, and a cooling step of cooling the substrate after the set time duration has elapsed.

In one embodiment of the method, the treating liquid may include sulfuric acid or phosphoric acid.

According to still another aspect, a support unit for supporting a substrate includes a support plate having an inner space defined therein, a heating member disposed in the inner space and emitting light for heating the substrate supported on the support unit, and a reflective member disposed along an edge region of the support plate and reflecting thermal energy of the light to an edge region of the substrate supported on the support unit.

In one embodiment of the support unit, the support plate may include an upper support plate, and a lower support plate disposed under the upper support plate and combined with the upper support plate to define the inner space therebetween, wherein transparency of the upper support plate may be greater than transparency of the lower support plate.

In one embodiment of the support unit, an inner region of an edge region of the lower support plate may be stepped, wherein the reflective member may be placed on a stepped top surface of the inner region.

In one embodiment of the support unit, an inner region of an edge region of the lower support plate may be inclined upwards along a radial direction of the support plate, wherein the reflective member may be coated on an inclined top surface of the inner region.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 6 is an enlarged view showing another portion of the support unit of FIG. 5;

DETAILED DESCRIPTION

Figure 1:
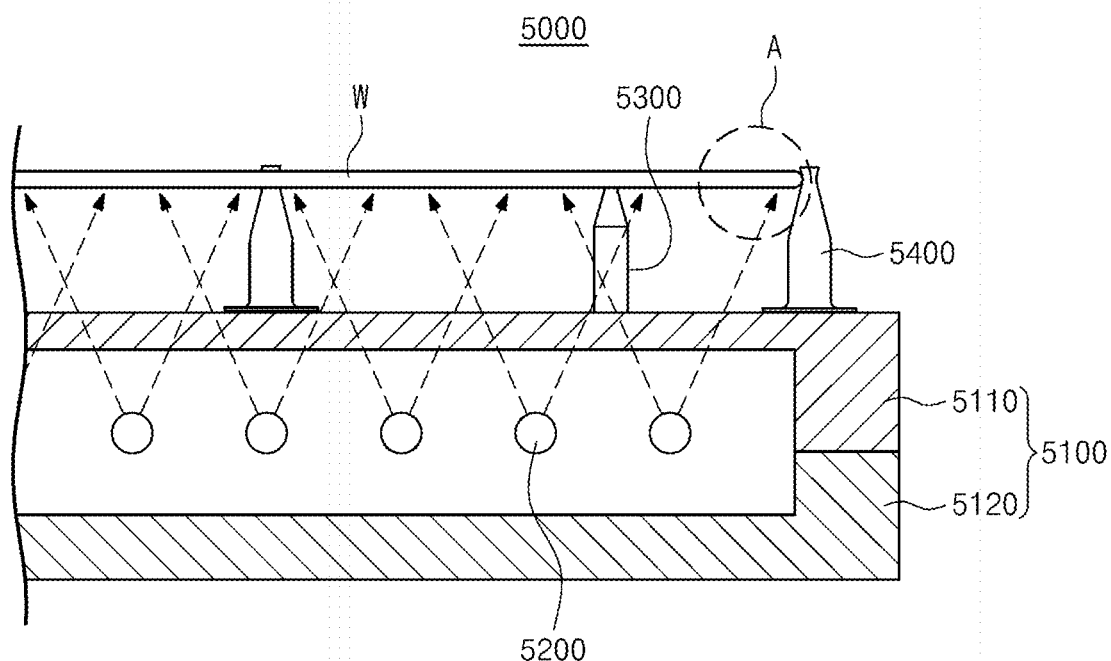
FIG. 1 is a view showing a state of heating a substrate in a general substrate treating apparatus.
Figure 2:
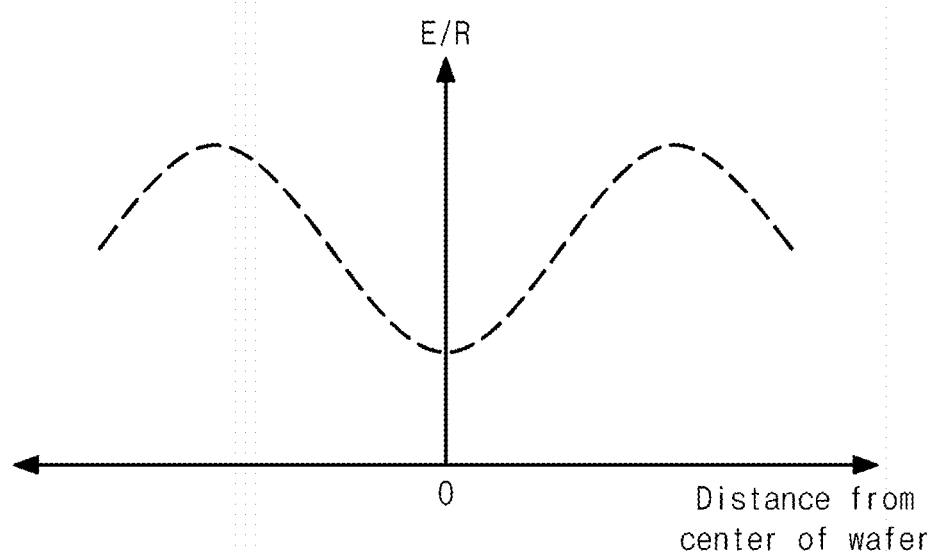
FIG. 2 is a diagram showing an etching rate based on a distance from a center of a substrate when the substrate treating apparatus of FIG. 1 treats the substrate.

Hereinafter, embodiments of the inventive concept will be described in detail with reference to the accompanying drawings so that those skilled in the art may easily implement the inventive concept. However, the inventive concept may be implemented in various different forms, and is not limited to the embodiments described herein. In addition, in describing a preferred embodiment of the inventive concept in detail, when it is determined that a detailed description of a related known function or configuration may unnecessarily obscure gist of the inventive concept, the detailed description thereof will be omitted. In addition, the same reference numerals are allocated to portions having similar actions and functions throughout the drawings.

It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof.

As used herein, the singular forms "a" and "an" are intended to include the plural forms as well, unless the context clearly indicates otherwise. For simplicity and clarity of illustration, elements in the figures are not necessarily drawn to scale.

Figure 3:
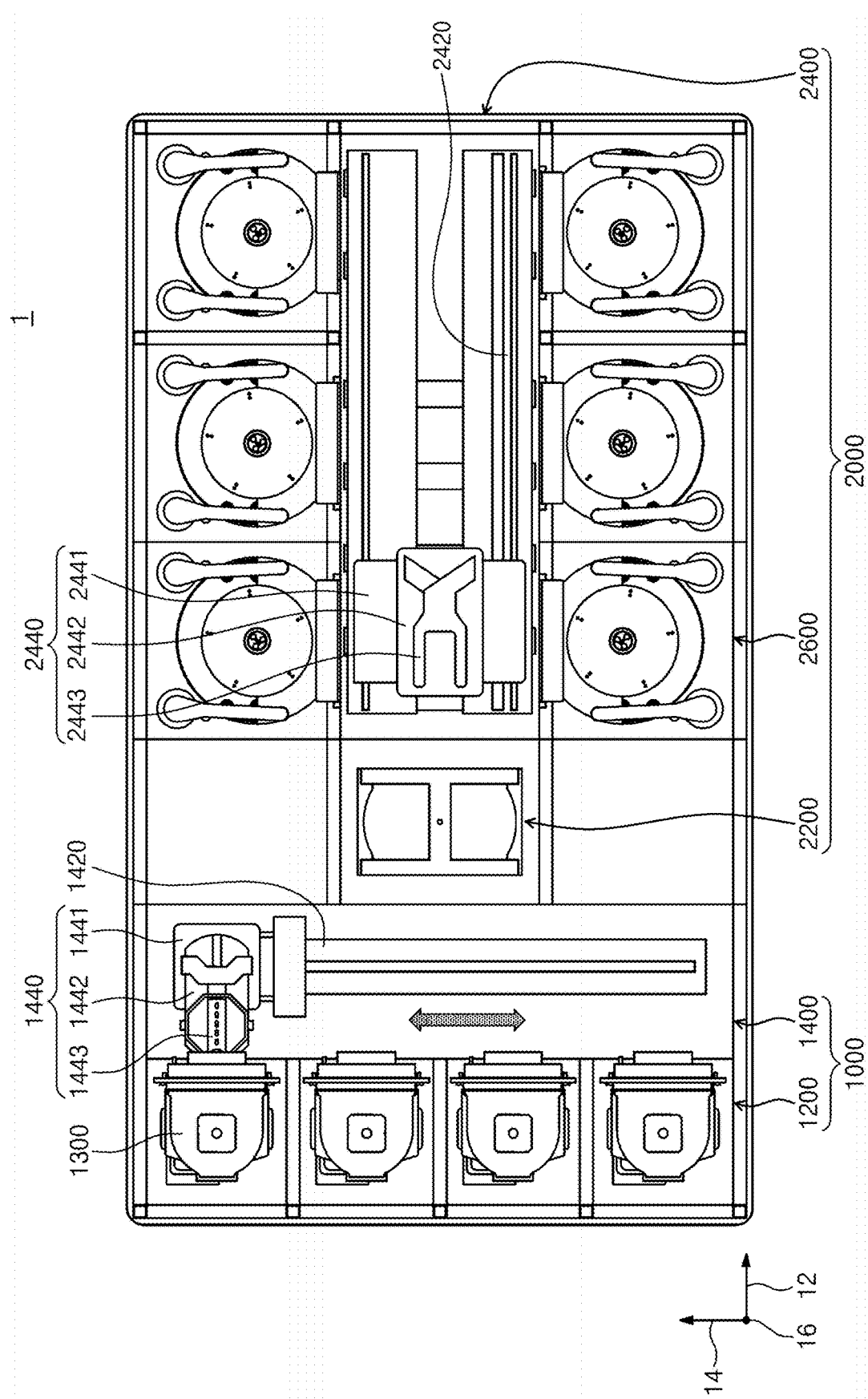
FIG. 3 is a plan view schematically showing a substrate treating apparatus provided with a substrate treating apparatus according to an embodiment of the inventive concept.

FIG. 3 is a plan view schematically showing a substrate treating apparatus 1 of the inventive concept.

Referring to FIG. 3, the substrate treating apparatus 1 includes an index module 1000 and a process treating module 2000. The index module 1000 includes a load port 1200 and a transfer frame 1400. The load port 1200, the transfer frame 1400, and the process treating module 2000 are sequentially arranged in series. Hereinafter, a direction in which the load port 1200, the transfer frame 1400, and the process treating module 2000 are arranged is referred to as a first direction 12. A direction perpendicular to the first direction 12 when viewed from above is referred to as a second direction 14. A direction perpendicular to a plane including the first direction 12 and the second direction 14 is referred to as a third direction 16.

A carrier 1300 in which the substrate W is stored is seated on the load port 1200. A plurality of load ports 1200 are arranged in a row along the second direction 14. FIG. 1 shows that four load ports 1200 are provided. However, the number of the load ports 1200 may increase or decrease depending on conditions such as process efficiency and footprint of the process treating module 2000. The carrier 1300 has a slot (not shown) defined therein to support an edge of a substrate W. A plurality of slots are arranged in the third direction 16. The substrates W are placed in the carrier 1300 in a stacked manner while the substrates W are spaced apart from each other along the third direction 16. The carrier 1300 may include FOUP (Front Opening Unified Pod).

The process treating module 2000 includes a buffer unit 2200, a transfer chamber 2400, and a process chamber 2600. The transfer chamber 2400 has a length direction parallel to the first direction 12. The process chambers 2600 are arranged on each of one side and the other side of the transfer chamber 2400 and along the second direction 14. The process chambers 2600 located on one side of the transfer chamber 2400 and the process chambers 2600 located on the other side of the transfer chamber 2400 may be symmetrical with each other respect to the transfer chamber 2400. Some of the process chambers 2600 are arranged along a length direction of the transfer chamber 2400. Further, some of the process chamber 2600 are stacked vertically. That is, on one side of the transfer chamber 2400, the process chambers 2600 may be arranged in a matrix of A×B (each of A and B is a natural number of 1 or greater). In this connection, A is the number of the process chambers 2600 arranged in a line along the first direction 12. B is the number of the process chambers 2600 arranged in series along the third direction 16. When 4 or 6 process chambers 2600 are arranged on one side of the transfer chamber 2400, the process chambers 2600 may be arranged in a 2×2 or 3×2 matrix. The number of the process chambers 2600 may be increased or decreased. Alternatively, the process chambers 2600 may be arranged only on one side of the transfer chamber 2400. Further, as described above, the process chambers 2600 may be arranged in a single layer on one side or on each of both sides of the transfer chamber 2400.

The buffer unit 2200 is disposed between the transfer frame 1400 and the transfer chamber 2400. The buffer unit 2200 provides a space where the substrate W stays before the substrate W is transferred between the transfer chamber 2400 and the transfer frame 1400. The buffer unit 2200 has a slot (not shown) in which the substrate W is placed. A plurality of slots (not shown) are arranged to be spaced apart from each other along the third direction 16. Each of a side of the buffer unit 2200 facing the transfer frame 1400 and a side thereof facing the transfer chamber 2400 is opened.

The transfer frame 1400 transfers the substrate W between the carrier 1300 mounted on the load port 1200 and the buffer unit 2200. An index rail 1420 and an index robot 1440 are disposed in the transfer frame 1400. The index rail 1420 has a length direction parallel to the second direction 14. The index robot 1440 is installed on the index rail 1420, and linearly moves along the index rail 1420 in the second direction 14. The index robot 1440 has a base 1441, a body 1442, and an index arm 1443. The base 1441 is installed to be movable along the index rail 1420. The body 1442 is coupled to the base 1441. The body 1442 is configured to be movable along the third direction 16 on the base 1441. Further, the body 1442 is configured to be rotatable on the base 1441. The index arm 1443 is coupled to the body 1442 and is configured to be movable forward and backward relative to the body 1442. A plurality of index arms 1443 may be configured to operate individually. The index arms 1443 are arranged in a stacked manner in a state in which the index arms are spaced apart from each other along the third direction 16. Some of the index arms 1443 may be used to transfer the substrate W from the process treating module 2000 to the carrier 1300. The rest thereof may be used to transfer the substrate W from the carrier 1300 to the process treating module 2000. This may prevent particles generated from the substrate W before the process treatment from being attached to the substrate W after the process treatment in a process in which the index robot 1440 imports and exports the substrate W.

The transfer chamber 2400 transfers the substrate W between the buffer unit 2200 and the process chamber 2600, and between the process chambers 2600. A guide rail 2420 and a main robot 2440 are disposed in the transfer chamber 2400. The guide rail 2420 has a length direction parallel to the first direction 12. The main robot 2440 is installed on the guide rail 2420, and moves linearly on the guide rail 2420 along the first direction 12. The main robot 2440 has a base 2441, a body 2442, and a main arm 2443. The base 2441 is installed to be movable along the guide rail 2420. The body 2442 is coupled to the base 2441. The body 2442 is configured to be movable along the third direction 16 and on the base 2441. Further, the body 2442 is configured to be rotatable on the base 2441. The main arm 2443 is joined to the body 2442, and is configured to move forward and backward relative to the body 2442. A plurality of the main arms 2443 may be configured to be individually driven. The main arms 2443 are arranged in a stacked manner in a state in which the main arms are spaced apart from each other along the third direction 16. The main arm 2443 used to transfer the substrate W from the buffer unit 2200 to the process chamber 2600 and the main arm 2443 used to transfer the substrate W from the process chamber 2600 to the buffer unit 2200 may be different from each other.

In the process chamber 2600, a substrate treating apparatus 10 for performing a cleaning process on the substrate W is disposed. The substrate treating apparatuses 10 respectively disposed in the process chambers 2600 may have different structures according to types of the cleaning process to be performed. Alternatively, the substrate treating apparatuses 10 respectively disposed in the process chambers 2600 may have the same structure. Alternatively, the process chambers 2600 may be divided into a plurality of groups, and the substrate treating apparatuses 10 respectively disposed in the process chambers 2600 belonging to the same group may have the same structure, and the substrate treating apparatuses 10 respectively disposed in the process chambers 2600 belonging to different groups may have different structures from each other. For example, when the process chambers 2600 are divided into two groups, a first group of process chambers 2600 may be arranged on one side of the transfer chamber 2400 and a second group of process chambers 2600 may be arranged on the other side of the transfer chamber 2400. Alternatively, the first group of process chambers 2600 may be disposed in a lower layer on each of one side and the other side of the transfer chamber 2400, while the second group of process chambers 2600 may be disposed in an upper layer on each of one side and the other side of the transfer chamber 2400. The first group of process chamber 2600 and the second group of process chamber 2600 may be distinguished from each other based on the types of chemicals as used or the types of the cleaning schemes.

In a following example, an apparatus for cleaning the substrate W using treating fluids such as high temperature sulfuric acid, alkaline chemicals, acidic chemicals, rinse liquids, and dry gas will be described by way of an example. However, a technical idea of the inventive concept is not limited thereto. The following example may be applied to all types of apparatuses performing a process while rotating the substrate W, such as an etching process.

Figure 4:
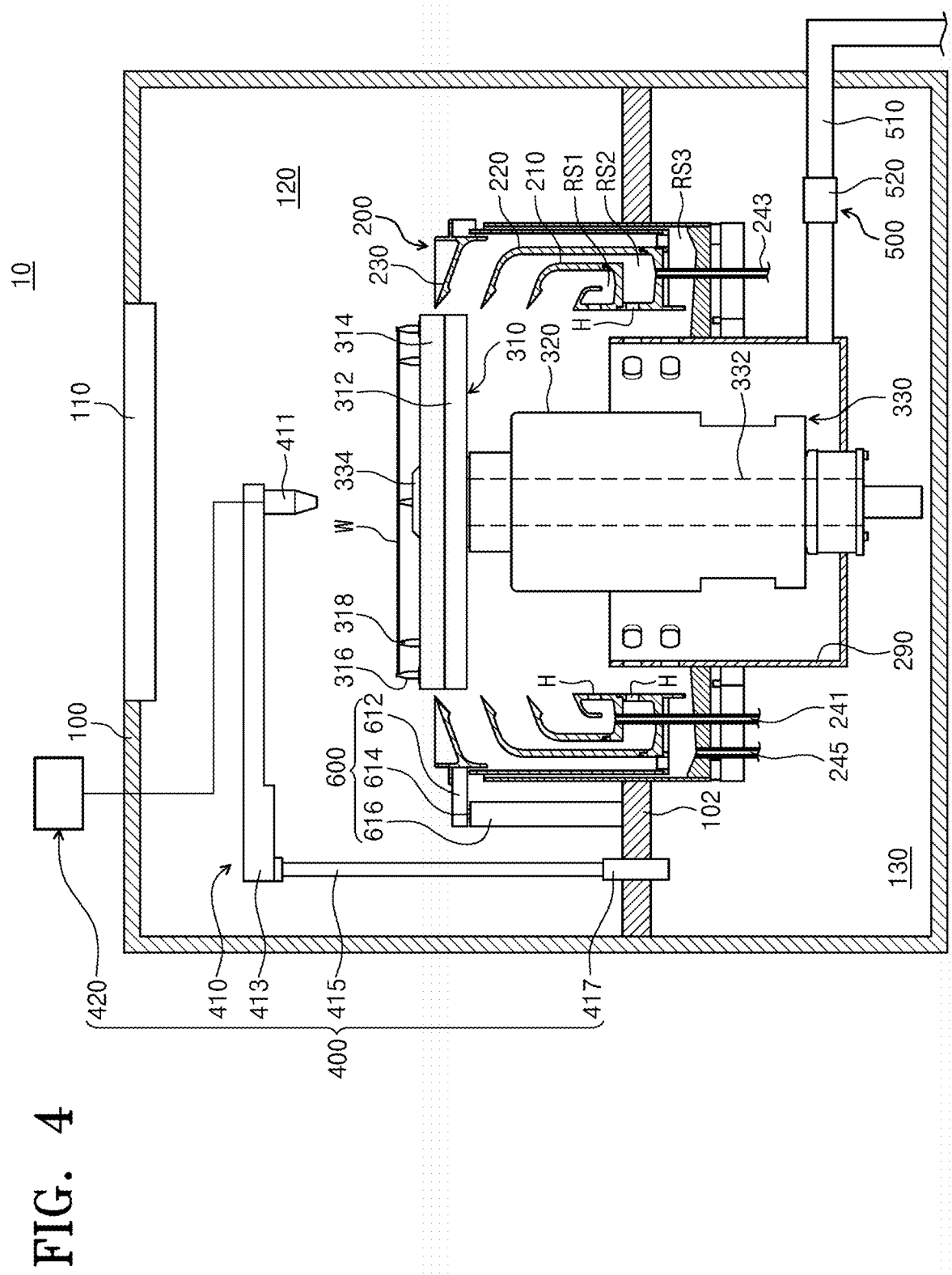
FIG. 4 is a cross-sectional view of a substrate treating apparatus according to an embodiment of the inventive concept.

FIG. 4 is a cross-sectional view of a substrate treating apparatus according to one embodiment of the inventive concept. Referring to FIG. 4, the substrate treating apparatus 10 includes a chamber 100, a bowl 200, a support unit 300, a liquid supply unit 400, an exhaust unit 500, an ascending and descending unit 600, and a controller 700.

The chamber 100 provides an enclosed interior space. A flow supply member 110 is installed at a top of the chamber 100. The flow supply member 110 generates downward flow inside the chamber 100.

The flow supply member 110 filters high humidity outside-air and supplies the same into the chamber 100. The high humidity outside-air passes through the flow supply member 110, and is supplied into the chamber 100, and generates a descending air flow. The downward air flow provides uniform flow above the substrate W, and discharges contaminants generated during the treatment of a surface of the substrate W using the treating fluid to the exhaust unit 500 through collection vessels 210, 220, and 230 of the bowl 200 together with air.

The chamber 100 is divided into a process region 120 and a maintenance region 130 via a horizontal partitioning wall 102. In the process region 120, the bowl 200 and the support unit 300 are located. An actuator for the ascending and descending unit 600, an actuator connected to the liquid supply unit 400, and a supply line in addition to collection lines 241, 243, and 245 connected to the bowl 200, and an exhaust line 510 are disposed in the maintenance region 130. The maintenance region 130 is isolated from the process region 120.

The bowl 200 has a cylindrical shape with an open top, and has a treating space for treating the substrate W. The opened top face of the bowl 200 acts as a passage for carrying out and carrying in the substrate W. The support unit 300 is located in the treating space. The support unit 300 rotates the substrate W in a state that the support unit 300 supports the substrate W during the process.

The bowl 200 provides a lower space whose a bottom is connected to an exhaust duct 290 to activate forced exhaust. In the bowl 200, the first to third collection vessels 210, 220 and 230 are disposed at different vertical levels to intake and suction the treating liquid scattered on the rotating substrate W and gases.

The annular first to third collection vessels 210, 220, and 230 have respectively exhaust holes H communicating with one common annular space. Specifically, each of the first to third collection vessels 210, 220, and 230 includes a bottom surface having an annular ring shape and a side wall having a cylindrical shape and extending from the bottom surface. The second collection vessel 220 surrounds the first collection vessel 210, and is spaced away from the first collection vessel 210. The third collection vessel 230 surrounds the second collection vessel 220, and is spaced away from the second collection vessel 220.

The first to third collection vessels 210, 220, and 230 respectively provide first to third collection spaces RS1, RS2, and RS3 into which the treating liquid scattered from the substrate W and a gas stream containing fume are introduced. The first collection space RS1 is defined in the first collection vessel 210, the second collection space RS2 is defined as a space between the first collection vessel 210 and the second collection vessel 220, and the third collection space RS3 is defined as a space between the second collection vessel 220 and the third collection vessel 230.

Each of top surfaces of the first to third collection vessels 210, 220 and 230 has a central opening. Each of the first to third collection vessels 210, 220, and 230 has a top inclined portion upwardly inclined from the connected side wall to the central opening. The treating liquid scattered from the substrate W flows into the collection spaces RS1, RS2 and RS3 along a surface of the top inclined portion of each of the first to third collection vessels 210, 220 and 230.

First treating liquid flowing into the first collection space RS1 is discharged to an outside through the first collection line 241. Second treating liquid flowing into the second collection space RS2 is discharged to the outside through the second collection line 243. Third treating liquid flowing into the third collection space RS3 is discharged to the outside through the third collection line 245.

The liquid supply unit 400 may treat the substrate W by supplying a treating liquid to the substrate W. The liquid supply unit 400 may supply heated treating liquid to the substrate W. The treating liquid may be a high-temperature chemical for etching the surface of the substrate W. For example, the chemical may be sulfuric acid, phosphoric acid, or a mixture of sulfuric acid and phosphoric acid.

A liquid nozzle member 410 includes a nozzle 411, a nozzle arm 413, a support rod 415, and a nozzle actuator 417. The nozzle 411 receives the treating liquid through a supply unit 420. The nozzle 411 discharges the treating liquid to the surface of the substrate W. The nozzle arm 413 has a long length in one direction, and the nozzle 411 is mounted on a front end of the nozzle arm 413. The nozzle arm 413 supports the nozzle 411. The support rod 415 is mounted at a rear end of the nozzle arm 413. The support rod 415 is located under the nozzle arm 413. The support rod 415 extends in a perpendicular manner to the nozzle arm 413. The nozzle actuator 417 is provided at a bottom of the support rod 415. The nozzle actuator 417 rotates the support rod 415 around a longitudinal axis of the support rod 415. Due to the rotation of the support rod 415, the nozzle arm 413 and the nozzle 411 swing using the support rod 415 as an axis. The nozzle 411 may swing into and out of the bowl 200. The nozzle 411 swings along a section between a central region and an edge region of the substrate W and discharges the treating liquid.

The exhaust unit 500 acts to exhaust an inside of the bowl 200. In one example, the exhaust unit 500 is configured for providing an exhaust pressure (suction pressure) to a collection vessel collecting the treating liquid among the first to third collection vessels 210, 220 and 230 during the process. The exhaust unit 500 includes the exhaust line 510 connected to the exhaust duct 290 and a damper 520. The exhaust line 510 receives the exhaust pressure from an exhaust pump (not shown) and is connected to a main exhaust line embedded in a bottom space of a semiconductor production line.

In one example, the bowl 200 is combined with the ascending and descending unit 600 to change a vertical position of the bowl 200. The ascending and descending unit 600 moves the bowl 200 in a vertical direction linearly. As the bowl 200 moves up and down, a relative vertical level of the bowl 200 relative to the support unit 300 is changed.

The ascending and descending unit 600 includes a bracket 612, a movable shaft 614, and an actuator 616. The bracket 612 is fixedly installed on an outer wall of the chamber 100. The movable shaft 614 movable in the vertical direction by the actuator 616 is fixedly coupled to the bracket 612. When the substrate W is loaded on the support unit 300 or unloaded from the support unit 300, the bowl 200 is lowered so that the support unit 300 protrudes above the bowl 200. Further, when the process is in progress, the vertical level of the bowl 200 is adjusted so that the treating liquid may be introduced into the collection vessels 210, 220, and 230 preset according to the type of the treating liquid supplied to the substrate W. The collection spaces RS1, RS2, and RS3 of the bowl 200 may collect different types of the treating liquids and contaminant gases.

The controller 700 may control the substrate treating apparatus 10. For example, the controller 700 may control the support unit 300 and the liquid supply unit 400. The controller 700 may control the support unit 300 and the liquid supply unit 400 to perform the operation of the substrate treating apparatus 10 and the substrate treating method as described later.

Figure 5:
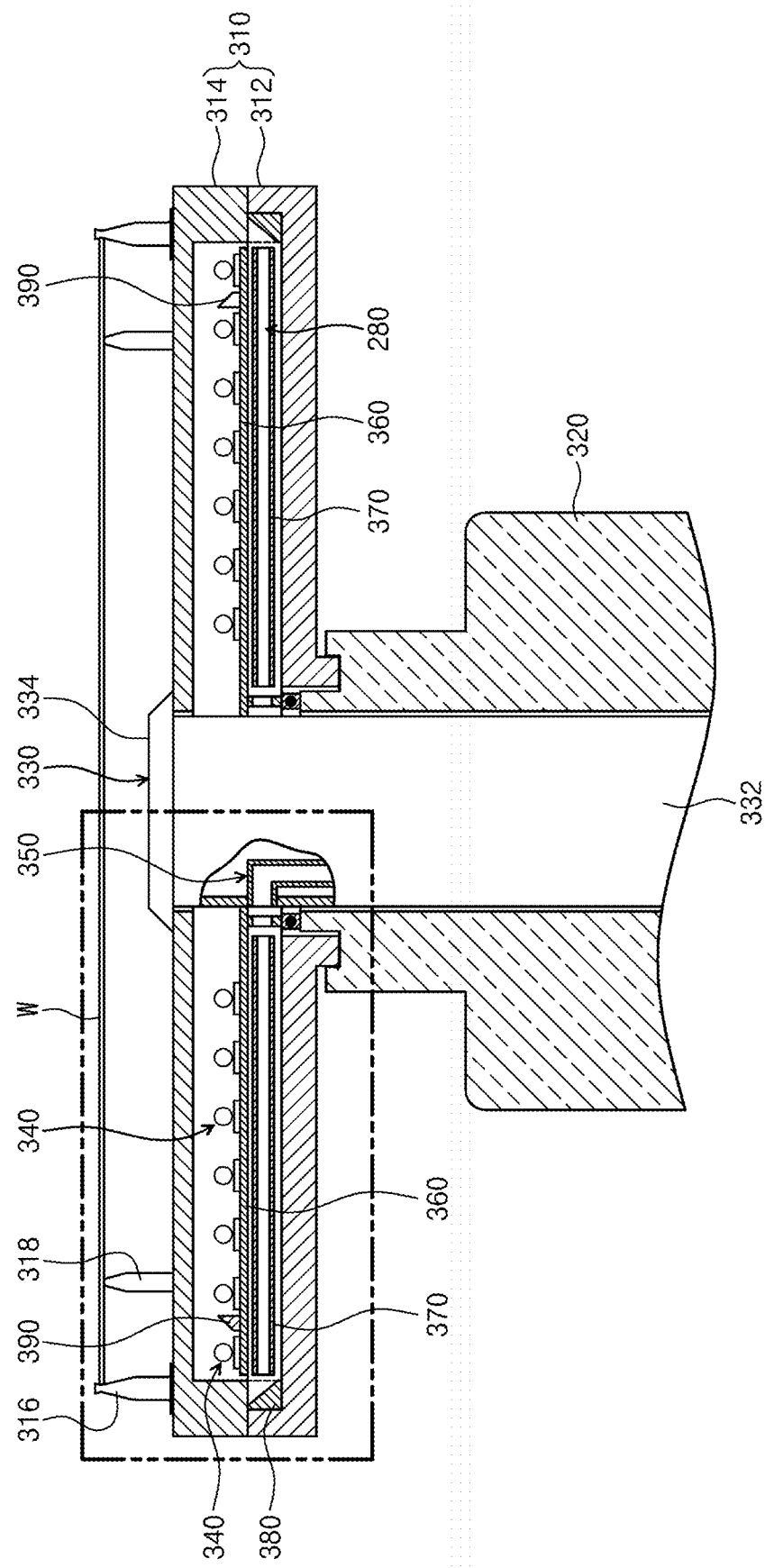
FIG. 5 is a cross-sectional view showing an embodiment of a support unit of FIG. 4.
Figure 6:
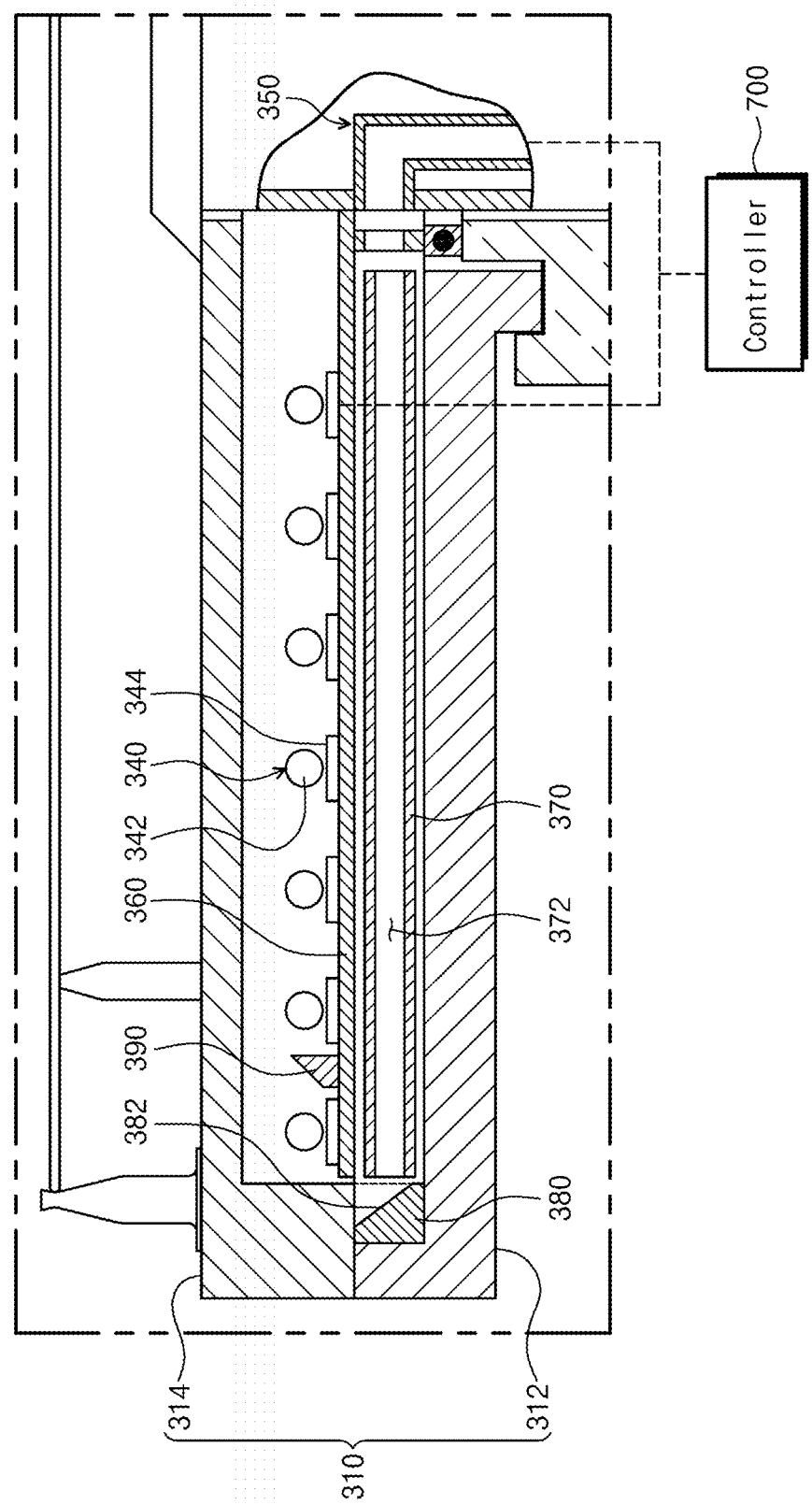
FIG. 6 is an enlarged view showing one portion of the support unit of FIG. 5.

FIG. 5 is a cross-sectional view showing an embodiment of the support unit of FIG. 4. FIG. 6 is an enlarged view showing one portion of the support unit of FIG. 5. Referring to FIG. 5 and FIG. 6, the support unit 300 supports the substrate W during the process, and may rotate the substrate W during the process.

The support unit 300 may include a support plate 310, a spin driver 320, a back nozzle 330, a heating member 340, a cooling member 350, an insulating plate 360, a heat dissipating plate 370, a reflective member 380, and a reflective ring 390.

The support plate 310 may have an inner space. The support plate 310 may include a lower support plate 312, and an upper support plate 314. The lower support plate 312 may be placed under the upper support plate 314. The lower support plate 312 may be combined with the upper support plate 314 to form an inner space therebetween. The lower support plate 312 may have a circular top surface. The lower support plate 312 may have an edge protruding upwards. The lower support plate 312 may be coupled to the spin driver 320 and may be rotated therewith. The lower support plate 312 may be made of a material including quartz. The lower support plate 312 may be processed via sanding, grinding, and other methods, so that opacity thereof may be high. The lower support plate 312 may have the opacity such that light emitted from the heating member 340 to be described later does not transmit the lower support plate 312.

The upper support plate 314 may be disposed above the substrate W and the lower support plate 312. The upper support plate 314 may be configured to protect the heating member 340. The upper support plate 314 may be made of a material including quartz. The upper support plate 314 may have high transparency because the upper support plate 314 is processed via fire polishing or other methods. The upper support plate 314 may have the transparency such that light emitted from the heating member 340 to be described later easily transmits the upper support plate 314. For example, the upper support plate 314 may be transparent. The transparency of the upper support plate 314 may be greater than that of the lower support plate 312.

Chucking pins 316 may be arranged along an edge of the lower support plate 312. The chucking pins 316 may be arranged along an edge region of the support plate 310. The chucking pins 316 may be arranged and be spaced apart from each other in a circumferential direction and along the edge region of the support plate 310. The chucking pins 316 may pass through the upper support plate 314 and protrude upwards from the upper support plate 314. The chucking pins 316 may chuck a side surface of the substrate W. The chucking pins 316 may align the substrate W such that the substrate W supported on a plurality of the support pins 318 is in a correct position. During the process, the chucking pins 316 come into contact with the side surface of the substrate W to prevent the substrate W from being separated from its correct position.

The upper support plate 314 may be rotated together with the lower support plate 312. The support pins 318 may be installed on the upper support plate 314. The support pins 318 may be arranged to be spaced apart from each other at a predetermined spacing along an edge of a top surface of the upper support plate 314. The support pins 318 may be configured to protrude upward from the top surface of the upper support plate 314. The support pins 318 may support a bottom surface of the substrate W so that the substrate W may be supported while being spaced upwards from the upper support plate 314.

Further, the chucking pins 316 and/or the support pins 318 may include a material which light emitted from the heating member 340 to be described later transmits. The chucking pins 316 and/or the support pins 318 may include a material which heat energy of light emitted from the heating member 340 transmits. For example, the chucking pins 316 and/or the support pins 318 may be made of glass. Further, the chucking pins 316 and/or the support pins 318 may be made of an insulating material. For example, the chucking pins 316 and/or the support pins 318 may be made of a material including ceramic or zirconia. Accordingly, it is possible to minimize loss of heat from the substrate W when the substrate W is in contact with the chucking pins 316 and/or the support pins 318.

The spin driver 320 has a hollow shape, and rotates the lower support plate 312 while being combined with the lower support plate 312. When the lower support plate 312 is rotated, the upper support plate 314 may be rotated together with the lower support plate 312. Further, the components disposed in the support plate 310 may be positioned in an independent manner from the rotation of the support plate 310. For example, the heating member 340, the insulating plate 360, the heat dissipating plate 370, etc. to be described later may be configured to be independent from the rotation of the support plate 310.

The back nozzle 330 is configured to spray a chemical onto a rear surface of the substrate W. The back nozzle 330 includes a nozzle body 332 and a chemical sprayer 334. The chemical sprayer 334 is located above a center of the lower support plate 312 and the upper support plate 314. The nozzle body 332 extends through the hollow spin driver 320 in an axial direction. A chemical flow line, a gas supply line, and a purge gas supply line may be defined inside the nozzle body 332. The chemical flow line supplies an etchant for etching of the rear surface of the substrate W to the chemical sprayer 334. The gas supply line supplies nitrogen gas for adjusting etching uniformity to the rear surface of the substrate W. The purge gas supply line supplies nitrogen purge gas to prevent penetration of the etchant into between the upper support plate 314 and the nozzle body 332.

Further, the chemical sprayer 334 may be made of a material including metal. The chemical sprayer 334 may be made of a material including silver and/or aluminum. The chemical sprayer 334 may be made of a material that reflects light emitted from the heating member 340. The chemical sprayer 334 may have a shape in which an edge region is inclined upwards in a direction from an outer side to a center thereof in a front cross-sectional view of the apparatus. Accordingly, light emitted from the heating member 340 may be reflected from the chemical sprayer 334 and transmitted to a central region of the substrate W.

The heating member 340 may heat the substrate W during the process. The heating member 340 may be disposed in an internal space of the support plate 310. The heating member 340 may emit light that heats the substrate W supported on the support unit 300. The heating member 340 is placed within the support plate 310. The heating member 340 may include a lamp 342 and a temperature controller 344.

The lamp 342 is installed above the lower support plate 312. The lamp 342 may have a ring shape. The lamp 342 may include a plurality of lamps. The lamps 342 may have different diameters. Each lamp 342 has the temperature controller 344 and thus may be controlled individually. Further, the lamp 342 may be an infrared lamp (IR lamp). The lamp 342 may emit light having a wavelength in the infrared region to heat the substrate W.

The heating member 340 may be subdivided into a number of concentric zones. Each zone may have each lamp 342 capable of individually heating each zone. The lamps 342 may have a ring shape and may be arranged concentrically and having different radial distances from a center of the lower support plate 312. The number of lamps 342 may be smaller or larger depending on a control target temperature. The heating member 340 may control the temperature of each individual zone to continuously increase or decrease the temperature along a radius of the substrate W during the process.

The cooling member 350 may supply a cooling fluid into the support plate 310. For example, the cooling member 350 may supply the cooling fluid to a flow path 372 defined in the heat dissipating plate 370 to be described later.

The insulating plate 360 is disposed within the support plate 310. Further, the insulating plate 360 is placed under the heating member 340 and within the support plate 310. The insulating plate 360 may be made of a material having low thermal conductivity. For example, the insulating plate 360 may be made of a material having a lower thermal conductivity than that of the heat dissipating plate 370 to be described later. In addition, the insulating plate 360 may be made of a material that is not discolored by infrared rays or heat irradiated by the lamp. For example, the insulating plate 360 may be made of a material including ceramic or zirconia.

The heat dissipating plate 370 may discharge the heat transferred from the insulating plate 360 to an outside. Further, the flow path 372 along which the cooling fluid supplied by the cooling member 350 flows may be defined in the heat dissipating plate 370. The heat dissipating plate 370 is placed within the support plate 310. Further, the heat dissipating plate 370 is placed under the insulating plate 360 and within the support plate 310. The heat dissipating plate 370 may be made of a material having high thermal conductivity. For example, the heat dissipating plate 370 may be made of a material having a higher thermal conductivity than that of the insulating plate 360 as described above. The heat dissipating plate 370 may be made of a material including metal. The heat dissipating plate 370 may be made of a material including aluminum and/or silver.

The reflective ring 390 may have a ring shape. The reflective ring 390 may be made of a material that reflects light emitted from the heating member 340. The reflective ring 390 may include a metal. The reflective ring 390 may be made of a material including aluminum and/or silver. The reflective ring 390 may be formed by plating silver on aluminum. The reflective ring 390 may be disposed between an outermost heating member 340 among the plurality of heating members 340 and a heating member 340 adjacent thereto. The reflective ring 390 may have a shape inclined upwardly in a direction toward a center from an outer side in a front cross-sectional view of the apparatus. For example, the reflective ring 390 may have a shape inclined upwards in a direction opposite to a direction in which an inclined surface 382 of the reflective member 380 to be described later is inclined upwards.

The reflective member 380 may extend along an edge region of the support plate 310. The reflective member 380 may extend along the edge region of the support plate 310 and reflect the heat energy of the light and transfer the same to the edge region of the substrate W. The reflective member 380 may be disposed under the upper support plate 314. The reflective member 380 may be disposed on the top surface of the lower support plate 312. For example, an inner region of the edge region of the lower support plate 312 may be stepped, and the reflective member 380 may be placed on a top surface of the stepped inner region of the lower support plate 312.

Figure 7:
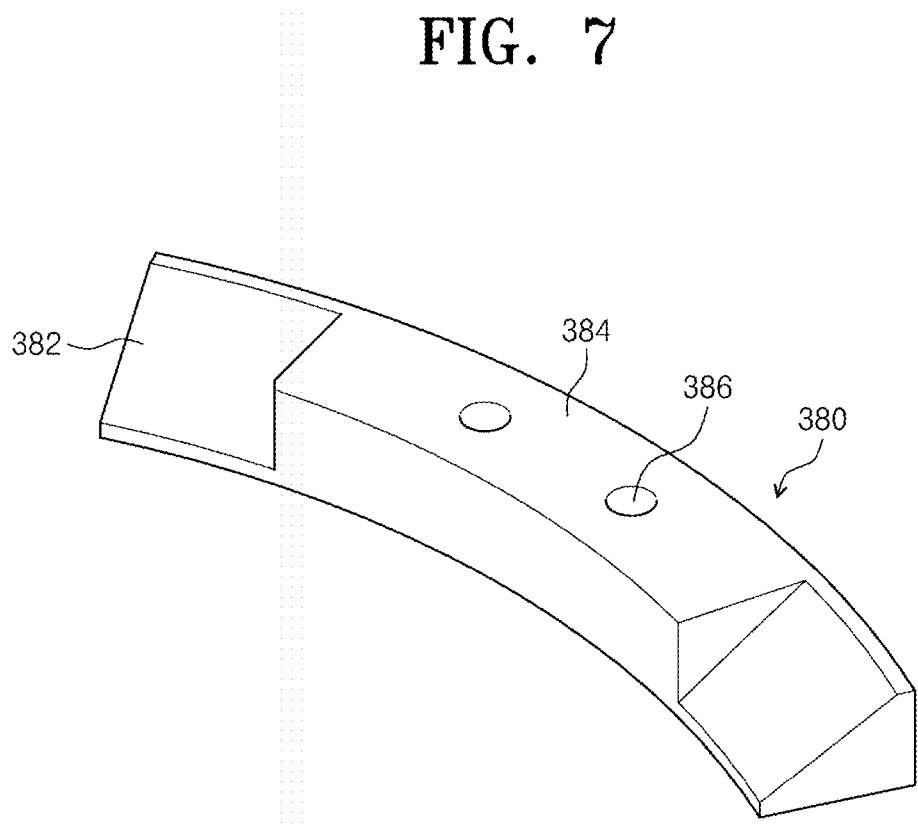
FIG. 7 is a view showing a reflective member of FIG. 6.

FIG. 7 is a view showing the reflective member of FIG. 6. Referring to FIG. 7, the reflective member 380 may have an arc shape. The reflective member 380 may include the inclined surface 382 that is inclined upward in a direction away from a center of the support plate 310 and along a radial direction of the support plate 310 in a front cross-sectional view of the apparatus. Further, the reflective member 380 may include a coupler 384 whose a top surface supports a bottom surface of the upper support plate 314 in a front cross-sectional view of the apparatus. The coupler 384 may be formed so that a top surface thereof is flat. Further, one or more holes 386 may be defined in the coupler 384. Fastening means for fastening the upper support plate 314 and the reflective member 380 to each other may be inserted into the hole 386. The fastening means may be screws or bolts, but is not limited thereto and may be modified into various known means.

Figure 8:
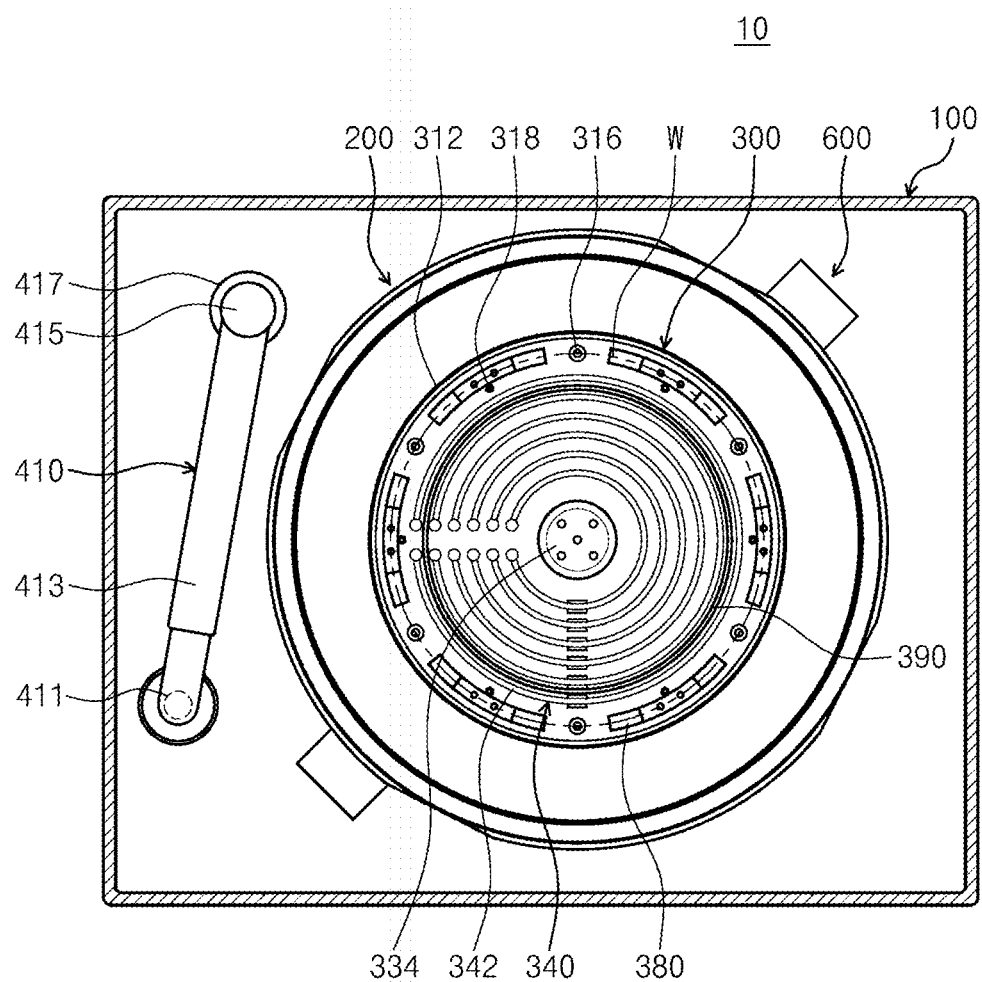
FIG. 8 is a view showing a state in which the reflective member of FIG. 7 is disposed in a support plate.

FIG. 8 is a view showing a state in which the reflective member of FIG. 7 is disposed in the support plate. The reflective member 380 may be disposed outside the outermost heating member 340 among the plurality of heating members 340. Further, the reflective member 380 may include a plurality of reflective members 380. Each of the reflective members 380 may be placed between adjacent chucking pins 316 when viewed from above. Further, when viewed from above, the reflective members 380 may be combined with each other to form a partially bent ring.

Figure 9:
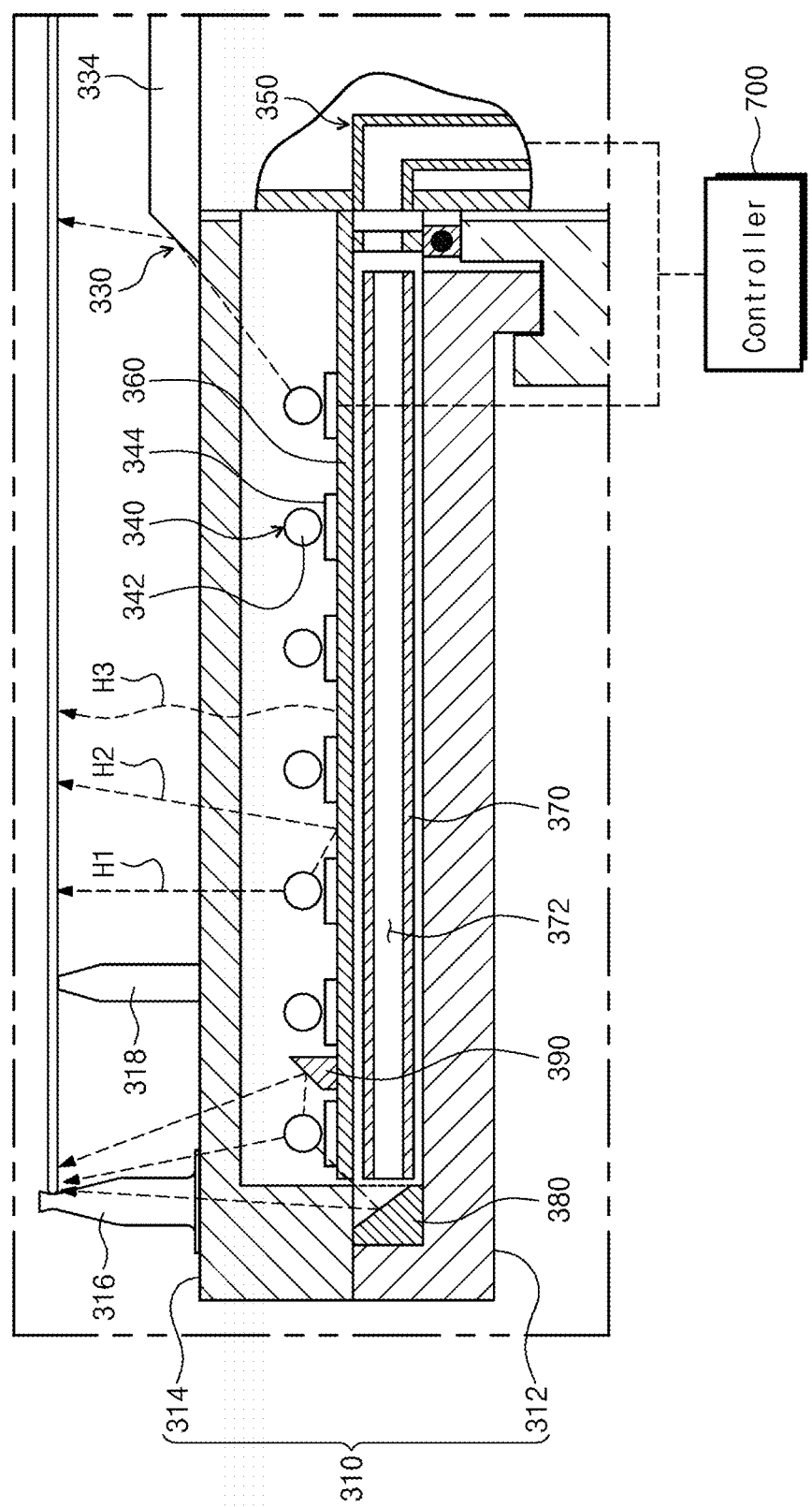
FIG. 9 is a view showing a state in which the support unit of FIG. 5 heats the substrate.

FIG. 9 is a view showing a state that the support unit of FIG. 5 heats the substrate. Referring to FIG. 9, the heating member 340 may heat the substrate W. For example, the lamp 342 of the heating member 340 may heat the substrate W by emitting light having a wavelength of an infrared region toward the substrate W. Light may have thermal energy. Heat for heating the substrate W as emitted from the heating member 340 may include direct radiant heat H1, indirect radiant heat H2, and convective radiant heat H3. The direct radiant heat H1 refers to the heat transferred directly to the substrate W via infrared radiation emitted from the heating member 340. The indirect radiant heat H2 refers to the heat transmitted to the substrate W via reflecting of the infrared radiation emitted from the heating member 340 from the insulating plate 360. The convective radiant heat H3 means heat radiated from the heated insulating plate 360 and then transferred to the substrate W. In one embodiment of the inventive concept, the direct radiant heat H1, the indirect radiant heat H2, and the convective radiant heat H3 are collected on the substrate W to increase the efficiency of heating the substrate W, thereby to shorten a time for the temperature of the substrate W to reach a target temperature to be described later. Thus, it is possible to improve the treating efficiency of the substrate W.

Further, the light emitted from the outermost heating member 340 among the plurality of heating members 340 may be directly transmitted to the edge region of the substrate W, or may be reflected from the reflective ring 390 and/or the reflective member 380 and then transferred to the edge region of the substrate W. Further, the light emitted from the innermost heating member 340 among the plurality of heating members 340 may be directly transmitted to the central region of the substrate W, or may be reflected from the inclined surface of the chemical sprayer 334 and then transferred to the central region of the substrate W.

Figure 10:
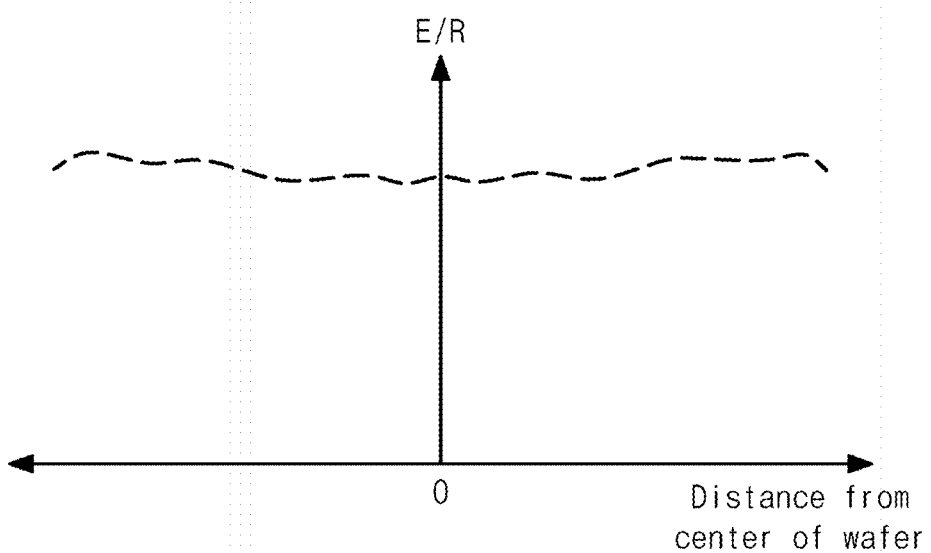
FIG. 10 is a view showing an etching rate based on a distance from a center of a substrate when a substrate treating apparatus according to an embodiment of the inventive concept treats the substrate.

When the substrate W is heated in a general substrate treating apparatus, the temperature of the central region and/or the edge region of the substrate W is low. This is because the number of lamps involved in heating the center region and the edge region of the substrate W is smaller than that in other regions thereof. Accordingly, the uniformity at which the substrate W is heated may be low. When the heating amount varies between the regions of the substrate W, the etching rate of the substrate W varies between the regions of the substrate W. In order to solve this problem, it is possible to consider installing an additional heat source under the center of the substrate W and under the edge of the substrate W. However, an installation space for additional lamps is insufficient due to the components of the support unit. However, in an embodiment of the inventive concept, the reflective member 380 is disposed along the edge region of the support plate 310. Further, the reflective ring 390 is disposed between the heating members 340. Accordingly, light emitted from the outermost heating member 340 is directly transmitted to the substrate W or is reflected from the reflective member 380 and the reflective ring 390 and indirectly transmitted to the substrate W. That is, it is possible to increase the heat collection efficiency onto the edge region of the substrate W. This principle may be equally applied to the central region of substrate W. That is, light is reflected by the chemical sprayer 334 and transmitted to the central region of substrate W. That is, it is possible to increase the heat collection efficiency onto the central region of the substrate W. Accordingly, it is possible to minimize a difference between the heating amounts of the regions of the substrate W. Accordingly, as shown in FIG. 10, the etching rate of the substrate W may be more uniform between the regions of the substrate W.

Figure 11:
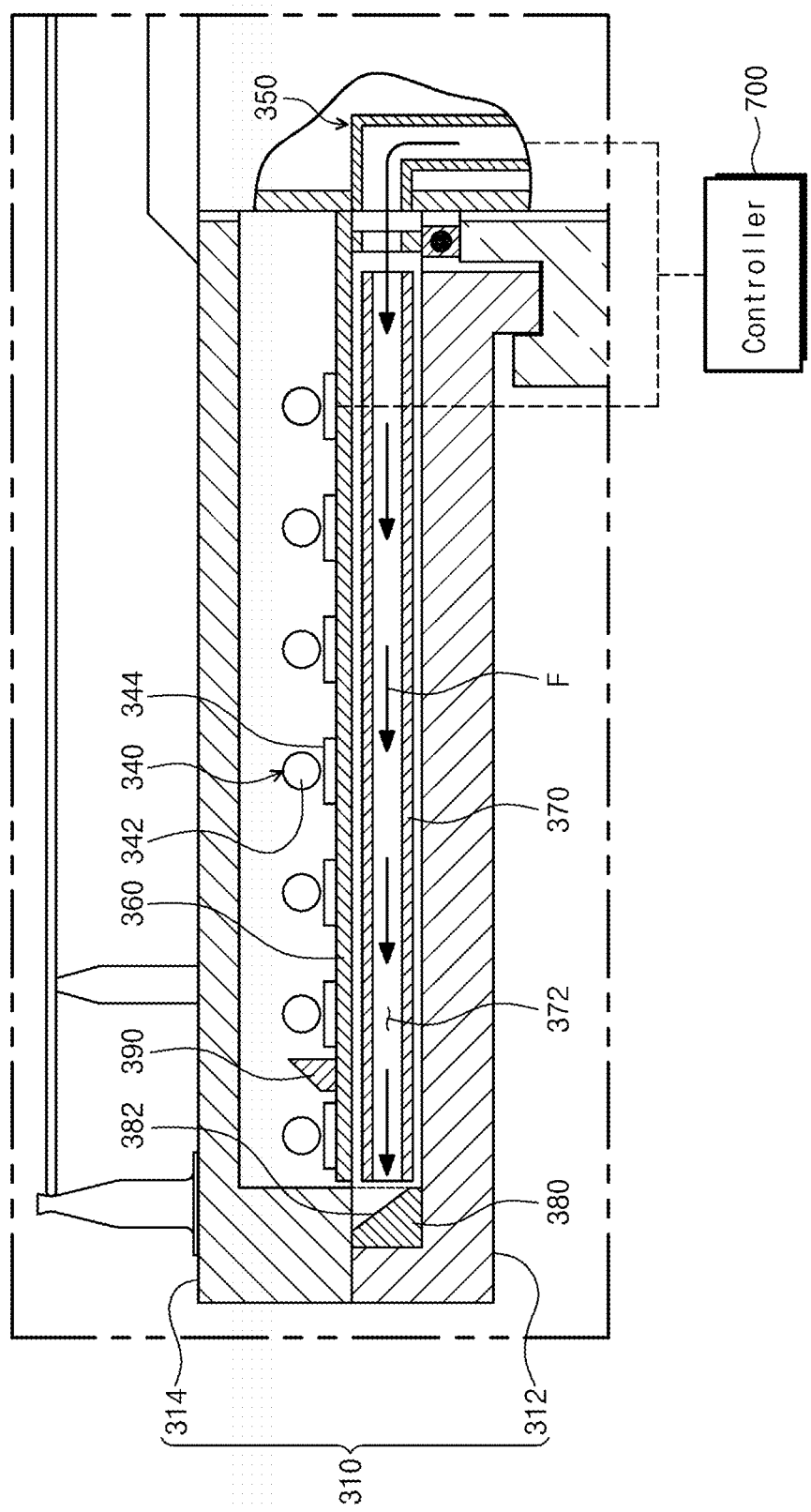
FIG. 11 is a view showing flow of fluid in the support unit of FIG. 5.

FIG. 11 is a view showing flow of fluid in the support unit of FIG. 5. Referring to FIG. 11, the cooling member 350 may supply the cooling fluid to the flow path 372 defined in the heat dissipating plate 370. The cooling fluid may be an inert gas or air. The inert gas may be nitrogen gas and air may be an external air stream. The cooling fluid supplied into the heat dissipating plate 370 cools the heat dissipating plate 370 while circulating inside the heat dissipating plate 370. The heat dissipating plate 370 cools to minimize the increase in the temperature of the spin driver 320. In addition, the heat dissipating plate 370 may keep a temperature of the insulating plate 360 constant.

Figure 12:
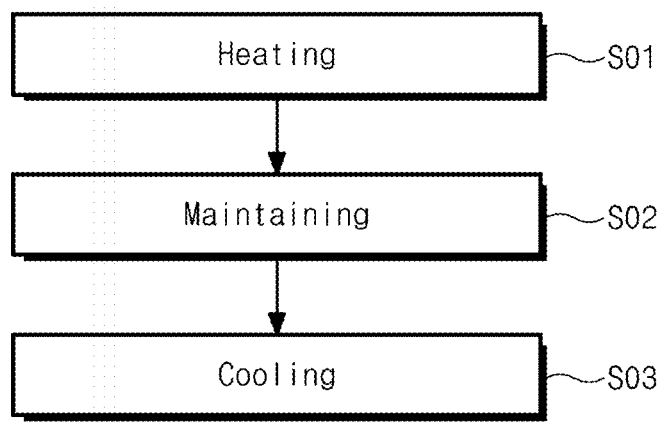
FIG. 12 is a flow chart showing a substrate treating method according to an embodiment of the inventive concept.
Figure 13:
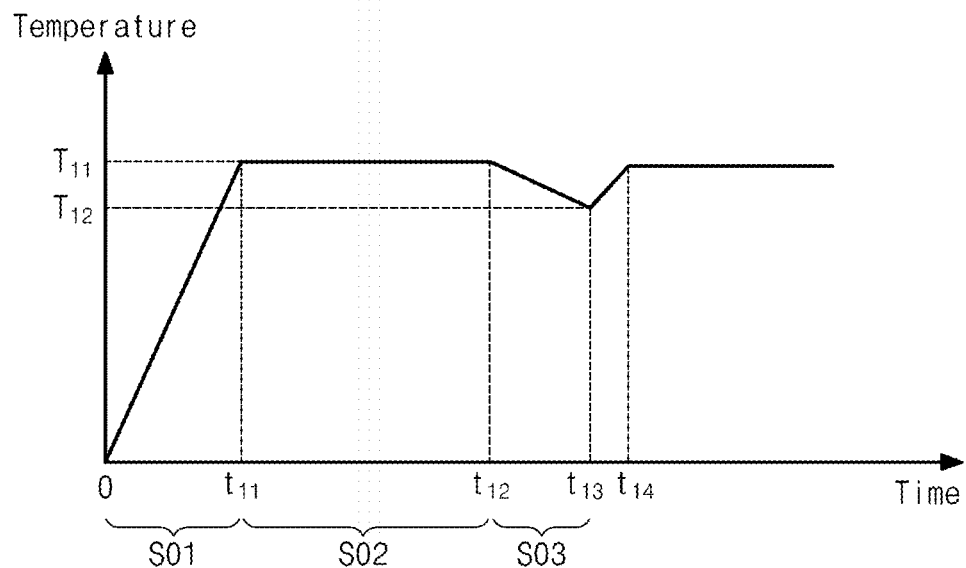
FIG. 13 is a view showing a temperature change of a substrate heated by a substrate treating apparatus according to an embodiment of the inventive concept.

FIG. 12 is a flow chart showing a substrate treating method according to an embodiment of the inventive concept. FIG. 13 is a view showing a temperature change of a substrate heated by a substrate treating apparatus according to an embodiment of the inventive concept. Referring to FIG. 12 and FIG. 13, the substrate treating method may treat a substrate by supplying a treating liquid to the substrate in a heated state thereof. Further, the substrate treating method may include a heating step S01, a maintaining step S02, and a cooling step S03.

The heating step S01 is a step of heating the substrate. The heating step S01 may be performed while the liquid supply unit 400 supplies the treating liquid to the substrate. In the heating step S01, a temperature of the substrate supported on the support plate 310 may be raised to a preset target temperature T11.

The maintaining step S02 is a step of maintaining the temperature of the heated substrate at the target temperature T11 for a set time duration t11 to t12. The maintaining step S02 may be performed after the heating step S01. The set time duration t11 to t12 in the maintaining step S02 may vary depending on a type of substrate to be treated or an etching rate required for the substrate.

The cooling step S03 is a step of cooling the substrate. The cooling step S03 may be performed after the maintaining step S02. In the cooling step S03, the cooling member 350 may supply the cooling fluid to the flow path 372 formed in the heat dissipating plate 370. When the above-described maintaining step S02 continues, the temperature of the spin driver 320 increases, so that the spin driver 320 may not normally operate. Accordingly, the cooling fluid is supplied to the heat dissipating plate 370 in the cooling step S03 to prevent the temperature of the spin driver 320 from becoming excessively high.

The heating step S01, the maintaining step S02, and the cooling step S03 may be repeatedly performed. Further, the heating step S01, the maintaining step S02, and the cooling step S03 may be performed on a single substrate. Further, a substrate on which the heating step S01 and the maintaining step S02 have been performed may be unloaded from the support unit 300 in the cooling step S03, and then an untreated substrate may be loaded onto the support unit 300. When the untreated substrate is loaded onto the support unit 300, the heating step, the maintaining step, and the cooling step may be performed again.

In a general substrate treating apparatus, it takes a long time for the temperature of the substrate to reach the target temperature in the heating step. Specifically, conventionally, heat for heating a substrate includes direct radiant heat transmitted from a lamp directly irradiating infrared rays to the substrate, and indirect radiant heat transmitted to the substrate via reflecting of the infrared rays from a reflector. However, according to an embodiment of the inventive concept, the heat transferred to the substrate includes the direct radiant heat H1, the indirect radiant heat H2, and the convective radiant heat H3. That is, not only the direct/indirect radiant heats H1 and H2 but also the convective radiant heat H3 radiated from the heated insulating plate 360 may be transferred to the substrate. As the direct/indirect radiant heat H1, H2, and the convective radiant heat H3 are collected on the substrate, the efficiency of the heating step S01 may be greatly improved. According to an embodiment of the inventive concept, the time duration 0 to t11 for which the temperature of the substrate reaches the target temperature T11 in the heating step S01 may be greatly shortened, and the target temperature T11 which the temperature of the substrate may reach may be further increased.

Further, the reflector provided in the conventional substrate treating apparatus is discolored when used for a long time or when a lamp applies high temperature heat to the reflector. Due to the discoloration of the reflector, the reflection of the infrared rays irradiated from the lamp is not made uniformly. Therefore, in the maintaining step, a hunting phenomenon in which the target temperature is not kept constant occurs. However, according to an embodiment of the inventive concept, the insulating plate 360 is made of a material that is not discolored by the heat or infrared rays. For example, the insulating plate 360 may be made of a material including ceramic or zirconia. Accordingly, even when the heating member 340 irradiates infrared rays to the insulating plate 360 or transmits high temperature heat thereto, the insulating plate 360 does not discolor. Thus, the hunting phenomenon does not occur in the maintaining step S02, and the temperature of the substrate may be kept constant at the target temperature T11.

Further, according to an embodiment of the inventive concept, the insulating plate 360 is made of a material having low thermal conductivity. For example, the insulating plate 360 may be made of a material having a lower thermal conductivity than that of the heat dissipating plate 370. The insulating plate 360 has low thermal conductivity, such that a temperature fluctuation range of the insulating plate 360 is smaller. Accordingly, the temperature of the insulating plate 360 may be kept constant using the heat dissipating plate 370 disposed under the insulating plate 360. When the temperature of the insulating plate 360 is kept constant, the temperature of the convective radiant heat H3 radiated from the insulating plate 360 to the substrate is constant. Thus, the uniformity of the substrate treatment may be further improved.

Further, because the insulating plate 360 is made of a material having the low thermal conductivity, an amount by which the temperature of the insulating plate 360 is lowered in the cooling step S03 is also smaller. Accordingly, an amount by which the target temperature T11 is lowered to a temperature T12 at which the substrate is cooled is smaller. Accordingly, after the cooling step S03, a time duration t13 to t14 for which the temperature of the substrate reaches the target temperature T11 is further shortened.

Further, according to an embodiment of the inventive concept, the heat dissipating plate 370 is disposed under the insulating plate 360 and is made of a material having high thermal conductivity. For example, the heat dissipating plate 370 may be made of a material having a higher thermal conductivity than that of the insulating plate 360. Because the heat dissipating plate 370 is made of a material with high thermal conductivity, the insulating plate 360 may more quickly dissipate the heat that may be transferred to the spin driver 320.

Figure 14:
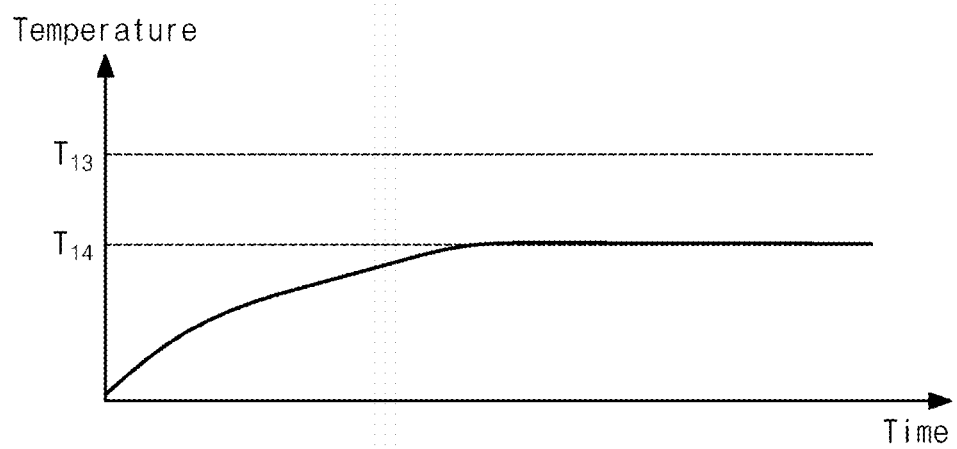
FIG. 14 is a view showing a temperature change of a spin driver in a substrate treating apparatus according to an embodiment of the inventive concept.

FIG. 14 is a view showing a temperature change of the spin driver in a substrate treating apparatus according to an embodiment of the inventive concept. Referring to FIG. 14, in an embodiment of the inventive concept, the heat dissipating plate 370 effectively dissipates the heat, such that the temperature of the spin driver 320 may be maintained at a temperature T14 lower than a reference temperature T13 at which the spin driver 320 abnormally operates. Thus, it is possible to minimize the abnormal operation of the spin driver 320. Further, it is possible to minimize a frequency of failure of the spin driver 320. Further, the maintaining step S02 may be performed for a longer time.

Figure 15:
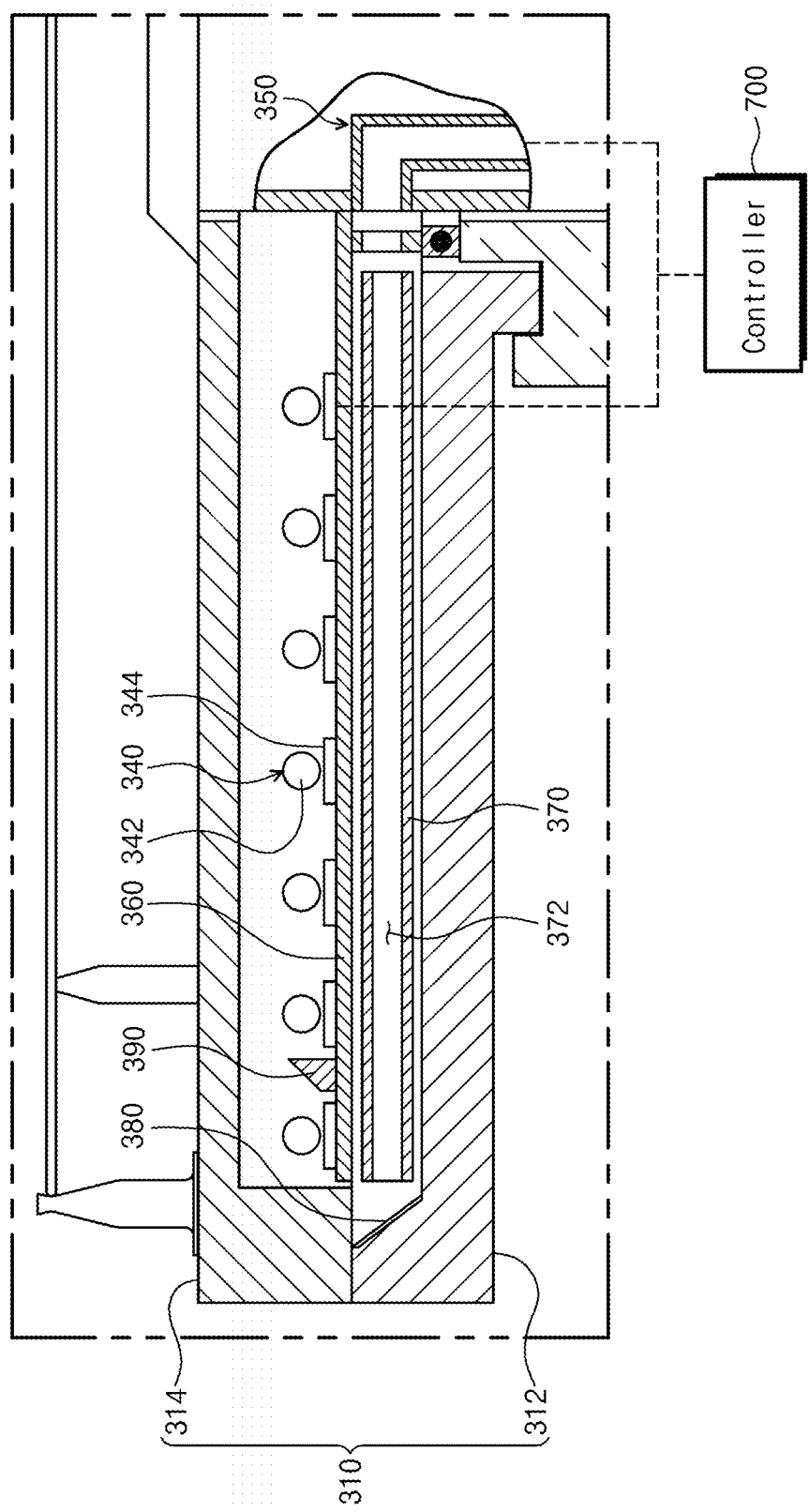
FIG. 15 is

In the above-described example, an example that the reflective member 380 is placed on the stepped top surface of the lower support plate 312 has been described. However, the present disclosure is not limited thereto. For example, the reflective member 380 may be embedded in the support plate 310. Further, the reflective member 380 may be provided in a form of a film. For example, as shown in FIG. 15, the inner region of the edge region of the lower support plate 312 may be inclined upwards in a direction away from a center and along the radial direction of the support plate 310. In addition, the reflective member 380 may be coated on the inclined top surface of the inner region.

In the above-described example, an example in which the cooling member 350 is configured for supplying the cooling fluid to the flow path 372 formed in the heat dissipating plate 370 has been described. However, the present disclosure is not limited thereto. For example, the cooling member 350 may be embodied as a cooling plate. The cooling member 350 as the cooling plate may be disposed under the heat dissipating plate 370. In addition, the cooling member 350 may be modified into various variants capable of cooling the heat dissipating plate 370.

According to an embodiment of the inventive concept, it is possible to efficiently treat a substrate.

In addition, according to an embodiment of the inventive concept, heating of the substrate may be uniformly performed.

In addition, according to an embodiment of the inventive concept, it is possible to improve an etching rate of a substrate.

In addition, according to an embodiment of the inventive concept, it is possible to minimize an increase in a temperature of the spin driver while maintaining the temperature of the substrate at a high temperature.

The effects of the inventive concept are not limited to the above-described effects, and effects not mentioned may be clearly understood by those of ordinary skill in the art from the present specification and the accompanying drawings.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
   a support unit supporting the substrate; and
   a liquid supply unit for supplying a treating liquid to the substrate supported on the support unit,
   wherein the support unit includes:
   a support plate having an upper support plate, a lower support plate, and an inner space between the upper support plate and the lower support plate;
   a heating member disposed in the inner space and configured to emit a light that is configured to heat the substrate supported on the support unit; and
   a reflective member disposed along an edge region of the lower support plate, such that a bottom surface of the upper support plate is in contact with an uppermost end of the reflective member, the reflective member configured to reflect heat energy of the light and transmit the heat energy to an edge region of the substrate supported on the support unit, wherein
   the lower support plate is disposed under the upper support plate and combined with the upper support plate to define the inner space therebetween,
   transparency of the upper support plate is greater than transparency of the lower support plate,
   the reflective member is placed under the upper support plate,
   an inner region of an edge region of the lower support plate is stepped, and
   the reflective member is disposed on a top surface of the stepped inner region.

2. The apparatus of claim 1, wherein the reflective member has an inclined surface inclined upwards in a direction away from a center of the support plate and along a radial direction of the support plate in a front cross-sectional view of the apparatus.

3. The apparatus of claim 1, wherein the heating member includes a plurality of heating members having concentric ring shapes of different radii, respectively,
   wherein the reflective member is disposed outside an outermost heating member among the plurality of heating members.

4. The apparatus of claim 3, wherein each heating member has an inclined surface inclined upwards in a direction away from a center of the support plate and along a radial direction of the support plate in a front cross-sectional view of the apparatus,
   wherein the support unit includes a reflective ring disposed between the outermost heating member among the plurality of heating members and a heating member adjacent to the outermost heating member,
   wherein the reflective ring has an inclined surface inclined upwards in a direction opposite to a direction in which the inclined surface of the heating member is inclined upwards in a front cross-sectional view of the apparatus.

5. The apparatus of claim 1, wherein the support unit further includes:
   an insulating plate disposed in the inner space and disposed under the heating member; and
   a heat dissipating plate disposed in the inner space and disposed under the insulating plate.

6. The apparatus of claim 5, wherein the heat dissipating plate is made of a material having higher thermal conductivity than thermal conductivity of the insulating plate.

7. The apparatus of claim 6, wherein a flow path along which a cooling fluid flows is defined in the heat dissipating plate.

8. The apparatus of claim 5, wherein the support plate is rotatable,
   wherein the heating member, the insulating plate, and the heat dissipating plate are configured to be independent from the rotation of the support plate.

9. An apparatus for treating a substrate, the apparatus comprising:
   a support unit supporting the substrate; and
   a liquid supply unit for supplying a treating liquid to the substrate supported on the support unit,
   wherein the support unit includes:
   a support plate having an inner space;
   a heating member disposed in the inner space and configured to emit a light configured to heat the substrate supported on the support unit; and
   a reflective member disposed along an edge region of the support plate, the reflective member configured to reflect heat energy of the light and transmitting the heat energy to an edge region of the substrate supported on the support unit,
   wherein the reflective member includes a plurality of reflective members,
   wherein each of the plurality of reflective members is disposed between adjacent chucking pins when the apparatus is viewed from above.

10. The apparatus of claim 9, wherein the reflective members are combined with each other to form a partially bent ring when the apparatus is viewed from above.

11. The apparatus of claim 9, wherein each of the chucking pins is composed of at least one of a transparent material or an insulating material.

12. An apparatus for treating a substrate, the apparatus comprising:
    a support unit supporting the substrate; and
    a liquid supply unit for supplying a treating liquid to the substrate supported on the support unit,
    wherein the support unit includes:
    a support plate having an inner space;
    a heating member disposed in the inner space and configured to emit a light to heat the substrate supported on the support unit; and
    a reflective member disposed along an edge region of the support plate, the reflective member configured to reflect heat energy of the light and transmitting the heat energy to an edge region of the substrate supported on the support unit,
    wherein the support plate includes:
    an upper support plate; and
    a lower support plate disposed under the upper support plate and combined with the upper support plate to define the inner space therebetween, wherein transparency of the upper support plate is greater than transparency of the lower support plate, wherein the reflective member is placed under the upper support plate, and wherein the reflective member further includes a coupler, wherein a bottom surface of the upper support plate is supported on a top surface of the coupler in a front cross-sectional view of the apparatus.

13. The apparatus of claim 12, wherein the top surface of the coupler is flat in a front cross-sectional view of the apparatus, wherein one or more holes are defined in the coupler, wherein coupling means fastened with the upper support plate is inserted into each hole.

14. The apparatus of claim 1, wherein the heating member includes an infrared lamp configured to emit infrared light.

15. The apparatus of claim 1, wherein the heating member is composed of a material including a metal.

16. The apparatus of claim 15, wherein the heating member is composed of a material including aluminum.

* * * * *